United States Patent
Jang et al.

(10) Patent No.: US 11,776,982 B2
(45) Date of Patent: Oct. 3, 2023

(54) IMAGE SENSOR CHIP

(71) Applicant: Samsung Electronics Co., Ltd., Suwon-si (KR)

(72) Inventors: Minho Jang, Suwon-si (KR); Doowon Kwon, Seongnam-si (KR); Dongchan Kim, Seongnam-si (KR); Bokwon Kim, Suwon-si (KR); Kyungrae Byun, Seoul (KR); Jungchak Ahn, Yongin-si (KR); Hyunyoung Yeo, Hwaseong-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 304 days.

(21) Appl. No.: 17/134,699

(22) Filed: Dec. 28, 2020

(65) Prior Publication Data
US 2021/0351220 A1    Nov. 11, 2021

(30) Foreign Application Priority Data
May 7, 2020    (KR) ........................ 10-2020-0054319

(51) Int. Cl.
*H01L 27/146* (2006.01)
*H01L 25/065* (2023.01)

(52) U.S. Cl.
CPC .... *H01L 27/14636* (2013.01); *H01L 25/0657* (2013.01); *H01L 27/14621* (2013.01); *H01L 27/14623* (2013.01); *H01L 27/14627* (2013.01); *H01L 2225/06541* (2013.01)

(58) Field of Classification Search
CPC ......... H01L 27/14636; H01L 27/14621; H01L 27/14623; H01L 27/14627; H01L 27/14634; H01L 25/0657; H01L 21/76898; H01L 23/481; H01L 27/1463; H01L 2225/06541
See application file for complete search history.

(56) References Cited

U.S. PATENT DOCUMENTS

| | | | |
|---|---|---|---|
| 9,536,777 B2* | 1/2017 | Lin | H01L 23/5226 |
| 9,728,572 B2 | 8/2017 | Park et al. | |
| 9,773,831 B1* | 9/2017 | Yang | H01L 27/14621 |
| 9,935,037 B2 | 4/2018 | Kang et al. | |
| 9,978,791 B2 | 5/2018 | Lu et al. | |
| 10,236,273 B2 | 3/2019 | Wang et al. | |
| 2015/0221695 A1* | 8/2015 | Park | H01L 23/481 |
| | | | 257/774 |

(Continued)

*Primary Examiner* — Fernando L Toledo
*Assistant Examiner* — Jahae Kim
(74) *Attorney, Agent, or Firm* — Muir Patent Law, PLLC

(57) ABSTRACT

An image sensor chip includes a lower chip, an upper chip stacked on the lower chip and including a photoelectric element, a via hole penetrating through the upper chip and penetrating through at least a portion of the lower chip, and a conductive connection layer electrically connecting the lower chip and the upper chip to each other in the via hole. The upper chip includes an upper substrate, an upper isolation layer and an upper element on the upper substrate, a connection contact plug, and a multilayer interconnection line electrically connected to the connection contact plug. A distance between an upper surface of the connection contact plug and an upper surface of the upper isolation layer is greater than a distance between an upper surface of an upper gate electrode of the upper element and an upper surface of the upper isolation layer.

20 Claims, 13 Drawing Sheets

(56) References Cited

U.S. PATENT DOCUMENTS

| | | |
|---|---|---|
| 2019/0051559 A1 | 2/2019 | Tsai et al. |
| 2019/0259799 A1 | 8/2019 | Chen et al. |
| 2020/0185445 A1* | 6/2020 | Yamagishi ........ H01L 27/14645 |

* cited by examiner

IMAGE SENSOR CHIP

CROSS-REFERENCE TO RELATED APPLICATION(S)

This application claims benefit of priority to Korean Patent Application No. 10-2020-0054319 filed on May 7, 2020 in the Korean Intellectual Property Office, the disclosure of which is incorporated herein by reference in its entirety.

BACKGROUND

The present disclosure relates to an image sensor chip, and more particularly, to an image sensor chip including a plurality of chips.

An image sensor chip, capturing an image and converting the captured image into an electrical signal, is not only mounted in a general-consumer electronic device such as a digital camera, a mobile phone camera, a portable video camera, or the like, but also may be included in a camera mounted in an automobile, a security device, a robot, and the like. Since such image sensor chips are desired to be miniaturized and to have high resolution, various studies have been conducted to satisfy demand for miniaturization and high resolution of such image sensor chips.

SUMMARY

Example embodiments provide an image sensor chip including a plurality of chips to implement miniaturization thereof.

According to an example embodiment, an image sensor chip includes a lower chip, an upper chip stacked on the lower chip and including a first photoelectric element, a first via hole penetrating through the upper chip and penetrating through at least a portion of the lower chip, and a first conductive connection layer in the first via hole. The lower chip includes a lower substrate having a first surface and a second surface opposing each other, a lower interconnection structure including a first lower pad on the first surface of the lower substrate, and a lower insulating layer covering the lower interconnection structure on the first surface of the lower substrate. The upper chip further includes an upper substrate having a third surface and a fourth surface opposing each other, an upper element and an upper interconnection structure on the third surface of the upper substrate, and an upper insulating layer covering the upper element and the upper interconnection structure on the third surface of the upper substrate. The third surface of the upper substrate and the first surface of the lower substrate face each other. The upper interconnection structure includes an upper circuit interconnection structure and an upper interconnection line structure. The upper circuit interconnection structure includes a circuit contact plug electrically connected to the upper element including an impurity region and a gate electrode, and a multilayer interconnection line electrically connected to the circuit contact plug. The upper interconnection line structure includes a connection contact plug and a multilayer interconnection line in contact with the connection contact plug. The first conductive connection layer is in contact with the connection contact plug in the upper chip and the first lower pad in the lower chip and is spaced apart from the multilayer interconnection line in the upper chip.

According to an example embodiment, an image sensor chip includes a lower chip, an upper chip stacked on the lower chip and including a photoelectric element, a via hole penetrating through at least a portion of the upper chip and penetrating through at least a portion of the lower chip, and a conductive connection layer electrically connecting the lower chip and the upper chip to each other in the via hole. The lower chip includes a lower substrate having a first surface and a second surface opposing each other, a lower interconnection structure including a first lower pad on the first surface of the lower substrate, and a lower insulating layer covering the lower interconnection structure on the first surface of the lower substrate. The upper chip includes an upper substrate having a third surface and a fourth surface opposing each other, an upper isolation layer and an upper element on the third surface of the upper substrate, an upper interconnection line structure on the upper isolation layer, an upper insulating layer covering the upper interconnection line structure on the upper isolation layer, and a separation structure penetrating through the upper substrate while being in contact with the upper isolation layer. The upper interconnection line structure includes a connection contact plug, in contact with the upper isolation layer and the conductive connection layer, and a multilayer interconnection line electrically connected to the connection contact plug. The upper element includes an upper gate electrode. A distance between an upper surface of the connection contact plug and an upper surface of the upper isolation layer is greater than a distance between an upper surface of the upper gate electrode and an upper surface of the upper isolation layer, when viewed based on the upper surface of the upper isolation layer.

According to an example embodiment, an image sensor chip includes a lower chip, an upper chip stacked on the lower chip and including a first photoelectric element and a second photoelectric element, a first via hole and a second via hole penetrating through at least a portion of the upper chip and penetrating through at least a portion of the lower chip, and a first conductive connection layer in the first via hole and a second conductive connection layer in the second via hole. The lower chip includes a lower substrate having a first surface and a second surface opposing each other, a lower interconnection structure including a first lower pad and a second lower pad on the first surface of the lower substrate, and a lower insulating layer covering the lower interconnection structure on the first surface of the lower substrate The upper chip further includes an upper substrate having a third surface and a fourth surface opposing each other, an upper element, an upper circuit interconnection structure, and an upper interconnection line structure on the third surface of the upper substrate, an upper insulating layer covering the upper element, the upper circuit interconnection structure, and the upper interconnection line structure on the third surface of the upper substrate, a backside insulating layer on the fourth surface of the upper substrate, a microlens overlapping the first photoelectric element on the backside insulating layer, and a light shielding layer overlapping the second photoelectric element on the backside insulating layer. The upper circuit interconnection structure includes a circuit contact plug, electrically connected to the upper element including a gate electrode, and a multilayer circuit interconnection electrically connected to the circuit contact plug on the circuit contact plug. The upper interconnection line structure includes a connection contact plug and a multilayer interconnection line in contact with the connection contact plug. The circuit contact plug and the connection contact plug include a plug layer and a barrier layer covering at least a sidewall of the plug layer. The first conductive connection layer is in contact with the connection contact plug and the first lower pad, and the second conductive connection layer is spaced apart from the multilayer interconnection line in the upper chip and is in contact with the second lower pad.

BRIEF DESCRIPTION OF DRAWINGS

The above and other aspects, features, and advantages of the present disclosure will be more clearly understood from the following detailed description, taken in conjunction with the accompanying drawings.

DETAILED DESCRIPTION

Hereinafter, example embodiments will be described with reference to the accompanying drawings.

Figure 1:
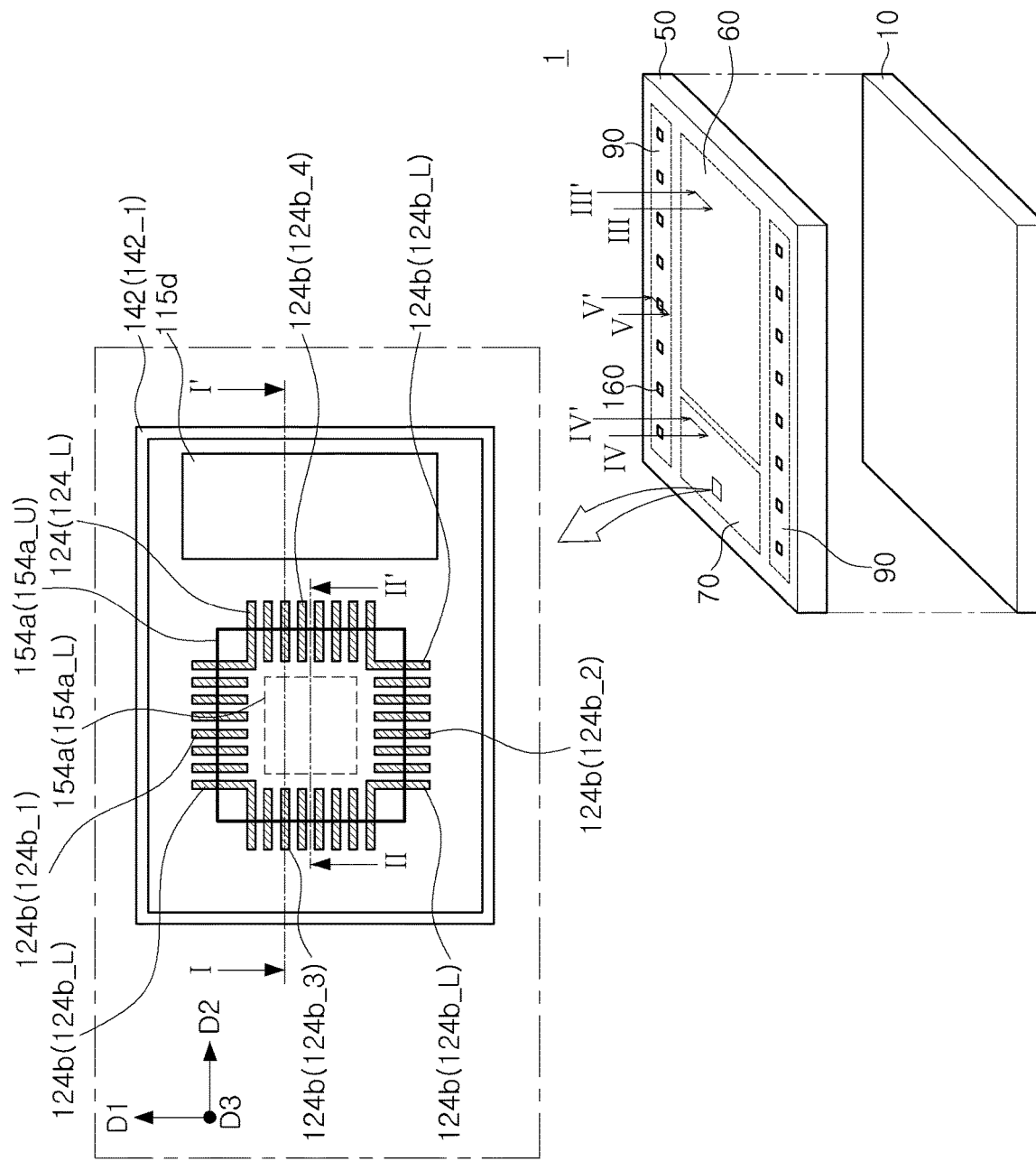
FIG. 1 is a schematic perspective view of an image sensor chip according to an example embodiment.
Figure 2A:
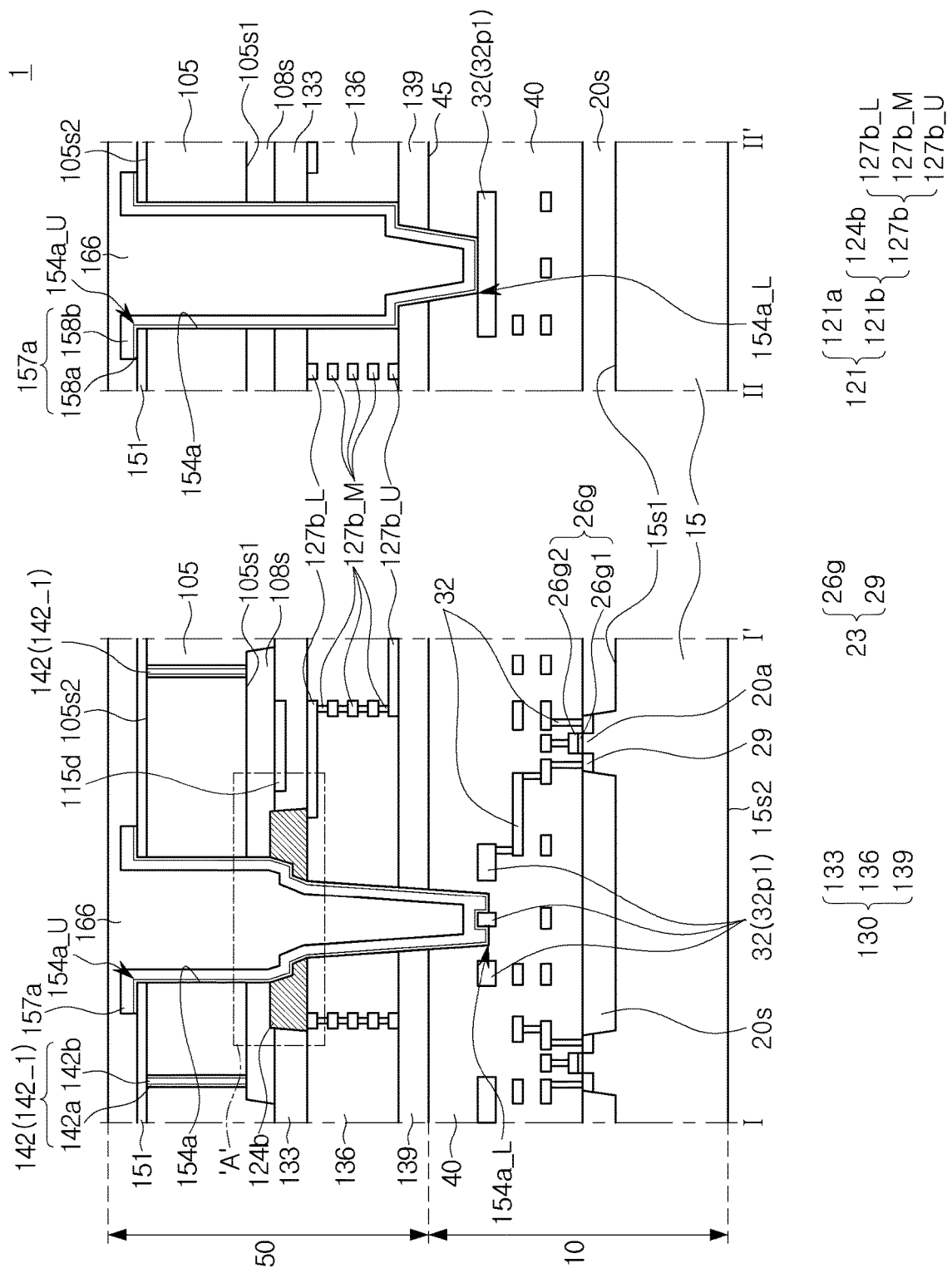
FIGS. 2A to 2C are schematic cross-sectional views of an image sensor chip according to an example embodiment.
Figure 2B:
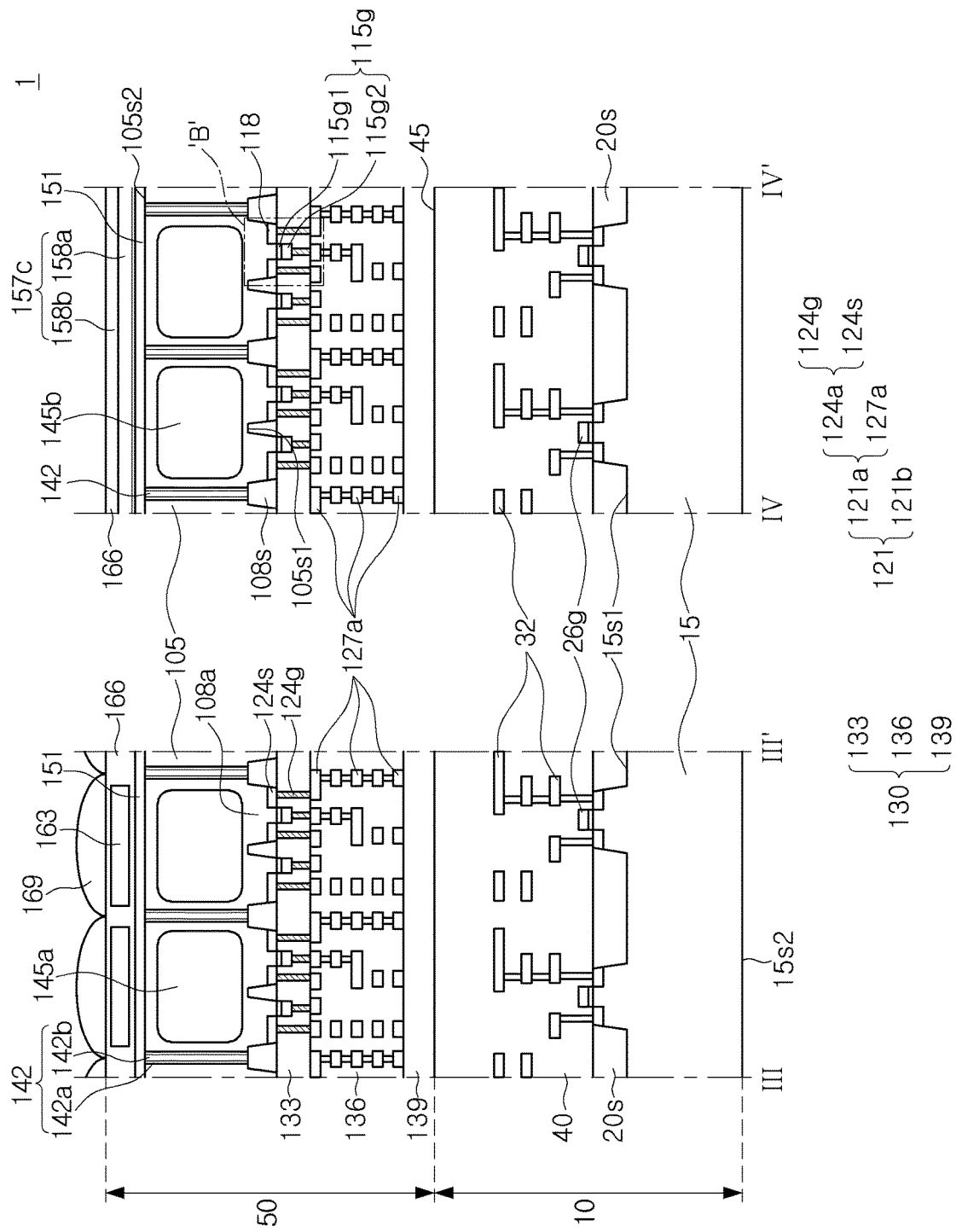
Figure 2C:
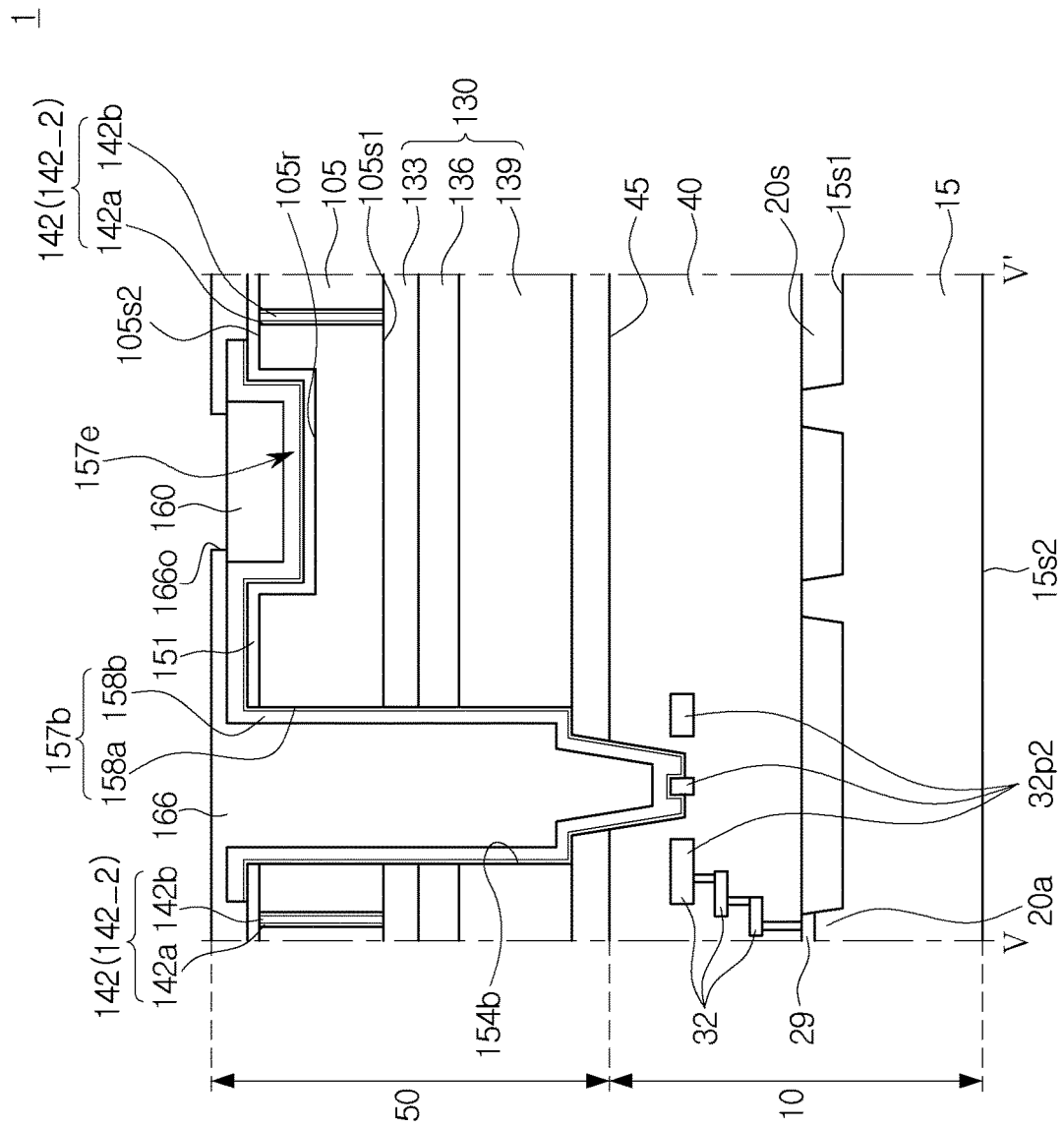

An image sensor chip according to an example embodiment will be described with reference to FIG. 1 and FIGS. 2A to 2C. FIG. 1 is a schematic perspective view of an image sensor chip according to an example embodiment, FIG. 2A is a cross-sectional view of regions taken along lines I-I' and II-II' in FIG. 1, FIG. 2B is a cross-sectional view of regions taken along lines and IV-IV' in FIG. 1, and FIG. 2C is a cross-sectional view of a region taken along line V-V in FIG. 1.

Referring to FIG. 1 and FIGS. 2A to 2C, an image sensor chip 1 according to an embodiment includes a lower chip 10, an upper chip 50 stacked on the lower chip 10, a bonding surface 45 between the lower chip 10 and the upper chip 50, a first via hole 154a (in FIG. 2A) penetrating through at least a portion of the upper chip 50 and penetrating at least a portion of the lower chip 10 to extend into the lower chip 10, and a first conductive connection layer 157a (in FIG. 2A) in the first via hole 154a. The first via hole 154a may extend into a lower insulating layer 40 of the lower chip 10.

The image sensor chip 1 may further include a second via hole 154b (in FIG. 2C), penetrating through at least a portion of the upper chip 50 and penetrating at least a portion of the lower chip 10 to extend into the lower chip 10, and a second conductive connection layer 157b (in FIG. 2C) having at least a portion disposed in the second via hole 154b. The second via hole 154b may extend into a lower insulating layer 40 of the lower chip 10.

In an example, the lower chip 10 may be a logic semiconductor chip.

The lower chip 10 may include a lower substrate 15 having a first surface 15s1 and a second surface 15s2 opposing each other, a lower isolation layer 20s defining a lower active region 20a on the lower substrate 15, a lower element 23 and a lower interconnection structure 32 on the first surface 15s1 of the lower substrate 15, and a lower insulating layer 40 covering the lower element 23 and the lower interconnection structure 32 on the first surface 15s1 of the lower substrate 15. The lower interconnection structure 32 may include a first lower pad 32p1 and a second lower pad 32p2. The various pads described herein may be connected to internal circuitry within the device to which they are connected, and may transmit signals and/or supply voltages to and/or from the device to which they are attached. For example, substrate pads disposed on the package substrate may connect to rerouting and other electrical lines disposed within the package substrate, and the pads disposed on the semiconductor chips may connect to an integrated circuit of one or more of the semiconductor chips. The various pads described herein may generally have a planar surface at a location for connecting to a terminal for external communications outside of the device to which the pads are connected. The pads may be formed of a conductive material, such as a metal, for example.

The lower element 23 may include a lower gate 26g and a lower source/drain region 29 in the lower active region 20a next to the lower gate 26g. The lower gate 26g may include a lower gate electrode 26g2 and a lower gate dielectric material 26g1 between the lower gate electrode 26g2 and the lower active region 20a.

The upper chip 50 may include a pixel array region 60 (in FIG. 1) including first photoelectric elements 145a. The upper chip 50 may further include a peripheral circuit region 70 (in FIG. 1) and a pad region 90 (in FIG. 1).

The upper chip 50 may include an upper substrate 105 having a third surface 50s1 and a fourth surface 50s2 opposing each other, an upper isolation layer 108s disposed on the third surface 105s1 of the upper substrate 105 to define an upper active region 108a, an upper element 112 and an upper interconnection structure 121 on the third surface 105s1 of the upper substrate 105, an upper insulating layer 130 covering the upper element 112 and the upper interconnection structure 121 on the third surface 105s1 of the upper substrate 105, and first photoelectric elements 145a and second photoelectric elements 145b in the upper substrate 105.

The third surface 105s1 of the upper substrate 105 and the first surface 15s1 of the lower substrate 15 may face each other.

Upper element 112 may be, for example, a group of components that form a circuit, such as a transistor that has a gate (e.g., 115g) formed on the substrate and an impurity region (e.g., 118) formed with the substrate. The impurity regions may include source/drain regions that are formed in or are epitaxially grown from the substrate. At least a portion of the upper element 112 may include an upper gate 115g on the upper active region 108a and an upper impurity region 118 in the upper active region 108a next to the upper gate 115g.

The upper gate 115g may include an upper gate electrode 115g2 and an upper gate dielectric material 115g1 between the upper gate electrode 115g2 and the upper active region 108a.

The upper interconnection structure 121 may include an upper circuit interconnection structure 121a and an upper interconnection line structure 121b.

The upper circuit interconnection structure 121a may include circuit contact plugs 124a and a multilayer circuit interconnection 127a on the circuit contact plugs 124a.

The circuit contact plugs 124*a* may include a first contact plug 124*s* and a second contact plug 124*g*.

The upper interconnection line structure 121*b* may include a connection contact plug 124*b* and a multilayer interconnection line 127*b* on and in contact with the connection contact plug 124*b*. It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

The connection contact plug 124*b* may be formed simultaneously with at least one of the first contact plug 124*s* and the second contact plug 124*g*. For example, the connecting contact plug 124*b*, the first contact plug 124*s*, and the second contact plug 124*g* may include a plug layer and a barrier layer covering at least a side surface of the plug layer. The barrier layer may cover side and bottom surfaces of the plug layer. The plug layer 125*b* of the connecting contact plug 124*b* and the plug layer 125 of the first contact plug 124*s* and the second contact plug 124*g* may all be formed of a metal nitride (e.g., titanium nitride (TiN), titanium aluminum nitride (TiAlN), tantalum nitride (TaN)), tungsten (W), or a combination thereof.

The first via hole 154*a* may penetrate through a portion of the upper isolation layer 108*s*, and the connection contact plug 124*b* may overlap the isolation layer 108*s* adjacent to the first via hole 154*a*.

The multilayer interconnection line 127*b* and the multilayer circuit interconnection 127*a* may be formed of the same material (for example, copper (Cu), or the like).

The multilayer interconnection line 127*b* may include a lower interconnection line layer 127*b*L, an upper interconnection line layer 127*b* U, and a middle interconnection line layer 127*b*_M disposed between the lower interconnection line layer 127*b*_L and the upper interconnection line layer 127*b*_U to electrically connect the lower interconnection line layer 127*b*_L and the upper interconnection line layer 127*b* U to each other. The lower interconnection line layer 127*b*_L may be in contact with the connection contact plug 124*b*. A portion of the upper interconnection line layer 127*b*_U may extend in a first horizontal direction D1 and/or a second horizontal direction D2 to be electrically connected to the multilayer circuit interconnection 127*a*.

The first conductive connection layer 157*a* may electrically connect the upper chip 50 and the lower chip 10 to each other while being in contact with the connection contact plug 124*b* and the first lower pad 32*p*1.

In an example, the first conductive connection layer 157*a* may be spaced apart from the multilayer interconnection line 127*b*. The multilayer interconnection line 127*b* may be formed of a copper (Cu) material, and the connection contact plug 124*b* may be formed of a conductive material, not including the copper material, for example, a metal nitride (e.g., titanium nitride (TiN), titanium aluminum nitride (TiAlN), tantalum nitride (TaN)), tungsten (W), or a combination thereof. The first via hole 154*a* extends through the connection contact plug 124*b*. As such, the formation of the first via hole 154*a* exposes surfaces of the connection contact plug 124*b*. The first via hole 154*a* does not extend through the multilayer interconnection line 127*b*. As such, the formation of the first via hole 154*a* does not expose surfaces of the multilayer interconnection line 127*b*. Because via hole 154*a* does not extend through the multilayer interconnection line 127*b* which is made of a copper material, copper residue may be prevented from being generated during formation of the first via hole 154*a* to prevent characteristics of the first and second photoelectric elements 145*a* and 145*b* being deteriorated by the copper residue. As a result, characteristics of the image sensor chip 1 may be prevented from being deteriorated by the copper residue.

The upper insulating layer 130 may include a first upper insulating layer 133, a second upper insulating layer 136, and a third upper insulating layer 139 sequentially stacked on the third surface 105*s*1 of the upper substrate 105. The circuit contact plug 124*a* and the connection contact plug 124*b* may be disposed in the first upper insulating layer 133. The multilayer circuit interconnection 127*a* and the multilayer interconnection line 127*b* may be disposed in the second upper insulating layer 136. The first upper insulating layer 133 may include a silicon oxide. The second upper insulating layer 136 may include a low-k dielectric. At least a portion of the second upper insulating layer 136 may be more porous than at least a portion of the third upper insulating layer 139. For example, at least a portion of the third upper insulating layer 139 may be formed of an insulating material (for example, a silicon oxide, a silicon nitride, a silicon oxynitride, or the like) harder than at least a portion of the second upper insulating layer 136 which may be formed of a low-k dielectric.

The first photoelectric elements 145*a* may be disposed in the pixel array region 60 (in FIG. 1), and the second photoelectric elements 145*b* may be disposed in a light shielding region of the peripheral circuit region 70 (in FIG. 1).

In an example, each of the first and second photoelectric elements 145*a* and 145*b* may be a silicon photodiode or a silicon photoelectric conversion element of an image sensor.

In an example, the upper chip 50 may further include a separation structure 142 penetrating through the upper substrate 105. The separation structure 142 may include a conductive layer 142*b* and an insulating layer 142*a* between the conductive layer 142*b* and the upper substrate 105. The conductive layer 142*b* may include polysilicon, and the insulating layer 142*a* may include a silicon oxide.

In an example, the separation structure 142 may be disposed to surround each of the first and second photoelectric elements 145*a* and 145*b*.

In an example, the separation structure 142 may be disposed to surround each of the first and second via holes 154*a* and 154*b*.

In an example, the separation structure 142 surrounding the first via hole 154*a* may be referred to as a first separation structure 142_1, and the separation structure 142 surrounding the second via hole 154*b* may be referred to as a second separation structure 142_2.

In an example, the upper chip 50 may further include a dummy gate electrode 115*d* adjacent to the first via hole 154*a*. The dummy gate electrode 115*d* may be in contact with the upper isolation layer 108*s*.

The dummy gate electrode 115*d* may be formed simultaneously with the upper gate electrode 115*g*2. Therefore, the dummy gate electrode 115*d* and the upper gate electrode 115*g*2 may be formed of the same material.

In an example, the dummy gate electrode 115*d* and the upper gate electrode 115*g*2 may be formed of polysilicon. However, example embodiments are not limited thereto. For example, the dummy gate electrode 115*d* and the upper gate electrode 115*g*2 may be formed of a metal nitride (e.g., titanium nitride (TiN), titanium aluminum nitride (TiAlN), tantalum nitride (TaN)), tungsten (W), or a combination thereof.

In an example, the upper chip 50 may further include a first backside insulating layer 151 on the fourth surface 105s2 of the upper substrate 105. The first backside insulating layer 151 may be an anti-reflective coating layer. The first backside insulating layer 152, disposed in the pixel array region 60, prevents reflection of light traveling from an external entity to the first photoelectric elements 145a. For example, the backside insulating layer 152 may prevent reflection of light on the fourth surface 105s2 of the upper substrate 105 to thereby increase transmissivity of light traveling into the first photoelectric elements 145a.

The first via hole 154a (in FIG. 2A) may extend into (e.g., through at least a portion) the lower insulating layer 40 through the first backside insulating layer 151 and the upper substrate 105, the upper isolation layer 108s, and the upper insulating layer 130. The second via hole 154b (in FIG. 2C) may extend into the lower insulating layer 40 through the first backside insulating layer 151, the upper substrate 105, the upper isolation layer 108s, and the upper insulating layer 130.

The first via hole 154a may extend through the connection contact plug 124b and expose surfaces of the connection contact plug 124b in the upper chip 50 and expose surfaces of the first lower pad 32p1 in the lower chip 10. The second via hole 154b may expose surfaces of the second lower pad 32p2 in the lower chip 10.

The first conductive connection layer 157a may cover a portion of a top surface (i.e., a surface opposite to the surface facing the upper substrate 105) of the first backside insulating layer 151 while covering a sidewall and a bottom surface of the first via hole 154a. The first conductive connection layer 157a may be in contact with the connection contact plug 124b and the first lower pad 32p1. The second conductive connection layer 157b may cover a portion of the top surface of the first backside insulating layer 151 while covering a sidewall and a bottom surface of the second via hole 154b. The second conductive connection layer 157b may be in contact with the second lower pad 32p2. The second conductive connection layer 157b may be spaced apart from the multilayer circuit interconnection 127a and the multilayer interconnection line 127b.

In an example, the upper chip 50 may further include a light shielding layer 157c overlapping the second photoelectric elements 145b on the first backside insulating layer 151.

In example embodiments, a region in which the second photoelectric elements 145b and the light blocking layer 157c are disposed may be referred to as a light shield region, and the pixel array region 60 in which the first photoelectric elements 145a are disposed may be referred to as a light receiving region.

In an example, the first and second connecting conductive layers 157a and 157b and the light shielding layer 157c may be formed of the same material. For example, the first and second connecting conductive layers 157a and 157b and the light shielding layer 157c may include a first layer 158a and a second layer 158b on the first layer 158a.

The first and second conductive connection layers 157a and 157b extend onto the first backside insulating layer 151 while covering internal walls of the first and second via holes 154a and 154b, respectively. Each of the first and second conductive connection layers 157a and 157b, disposed on the first backside insulating layer 151, may have substantially the same thickness as the light shielding layer 157c. Terms such as "same," "equal," "planar," or "coplanar," as used herein encompass identicality or near identicality including variations that may occur, for example, due to manufacturing processes. The term "substantially" may be used herein to emphasize this meaning, unless the context or other statements indicate otherwise.

In an example, the upper chip 50 may further include a second backside insulating layer 166 on the first and second conductive connection layers 157a and 157b and the light shielding layer 157c.

In an example, in the pixel array region 60, the upper chip 50 may further include color filters 163 in the second backside insulating layer 166 and a microlens 169 in the second backside insulating layer 166. The microlens 169 may overlap the first photoelectric element 145a.

In an example, the upper chip 50 further includes a chip pad 160, in contact with an extending portion 157e of the second conductive connection layer 157b, in the pad region 90. At least a portion of the chip pad 160 may be disposed in a recessed region 105r of the upper substrate 105. The second backside insulating layer 166 may have an opening 166o exposing at least a portion of the chip pad 160.

In an example, the connection contact plug 124b may include a plurality of bar patterns extending in a direction perpendicular to the sidewall of the first via hole 154a.

In an example, the connection contact plug 124b may include the first and second bar patterns 124b_1 and 124b_2, spaced apart from each other while opposing each other, and third and fourth bar patterns 124b_3 and 124b_4 spaced apart from each other while opposing each other.

In an example, each of the first and second bar patterns 124b_1 and 124b_2 may have a shape of a bar extending in a first horizontal direction D1, and each of the third and fourth bars patterns 124b_3 and 124b_4 may have a shape of a bar extending in a second horizontal direction D2, perpendicular to the first horizontal direction D1, when viewed from above.

In an example, among the first bar patterns 124b_1 and the third bar patterns 124b_3, adjacent bar patterns may be connected to each other to have an "L" shape.

In an example, among the first bar patterns 124b_1 and the fourth bar patterns 124b_4, adjacent bar patterns may be connected to each other to have an "L" shape.

In an example, among the second bar patterns 124b_2 and the third bar patterns 124b_3, adjacent bar patterns may be connected to each other to have an "L" shape.

In an example, among the second bar patterns 124b_2 and the fourth bar patterns 124b_4, adjacent bar patterns may be connected to each other to have an "L" shape.

In an example, an upper end 154a_U of the sidewall of the first via hole 154a may overlap the connection contact plug 124b in a vertical direction D3, and a lower end 154a_L of the sidewall of the first via hole 154a may not overlap the contact plug 124b in the vertical direction D3.

Figure 3A:
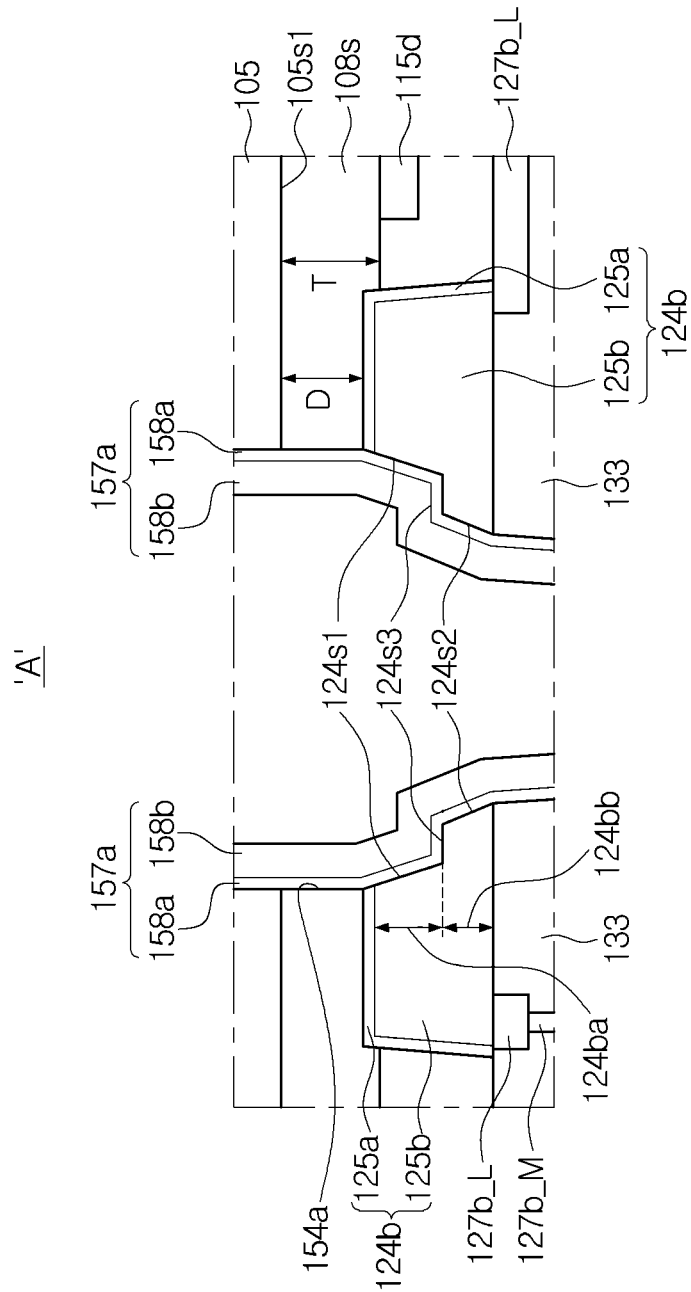
FIGS. 3A and 3B are partially enlarged views of an image sensor chip according to an example embodiment.

Next, examples of the first connection contact plug 124b and the first conductive connection layer 157a will be described with reference to FIG. 3A. FIG. 3A is a partially enlarged partial view of a region denoted by 'A' in FIG. 2A.

Referring to FIGS. 1, 2A, and 3A, the connection contact plug 124b may include a barrier layer 125a and a plug layer 125b. The barrier layer 125a may cover a side surface and a bottom surface of the plug layer 125b. The bottom surface of the plug layer 125b may be a surface of the plug layer 125b facing the third surface 105s1 of the upper substrate 105. The lower interconnection line layer 127b_L may be in contact with an upper surface of the plug layer 125b.

In an example, the barrier layer 125a may be formed of a metal nitride such as TiN or the like, and the plug layer 125b may be formed of a metal such as tungsten or the like.

A portion of the connection contact plug 124b, in contact with the first conductive connection layer 157a, may include a first side portion 124s1, a second side portion 124s2, and an inflection portion 124s3 between the first side portion 124s1 and the second side portions 124s2. The inflection portion 124s3 may extend in a first direction substantially parallel to the third surface 105s1 of the upper substrate 105. The first side portion 124s1 and the second side portion 124s2 may extend in a second direction that intersects the first direction.

In the connection contact plug 124b, a thickness of a first portion 124ba having the first side portion 124s1 may be greater than a thickness of a second portion 124bb having the second side portion 124s2. A distance between the first side portion 124s1 and the upper substrate 105 may be less than a distance between the second side 124s2 and the upper substrate 105.

In an example, the connection contact plug 124b may be in contact with the upper isolation layer 108s.

In an example, the connection contact plug 124b may extend into a portion of the upper isolation layer 108s. A distance D between the connection contact plug 124b and the third surface 105s1 of the upper substrate 105 may be less than a maximum thickness T of the upper isolation layer 108s.

Figure 3B:
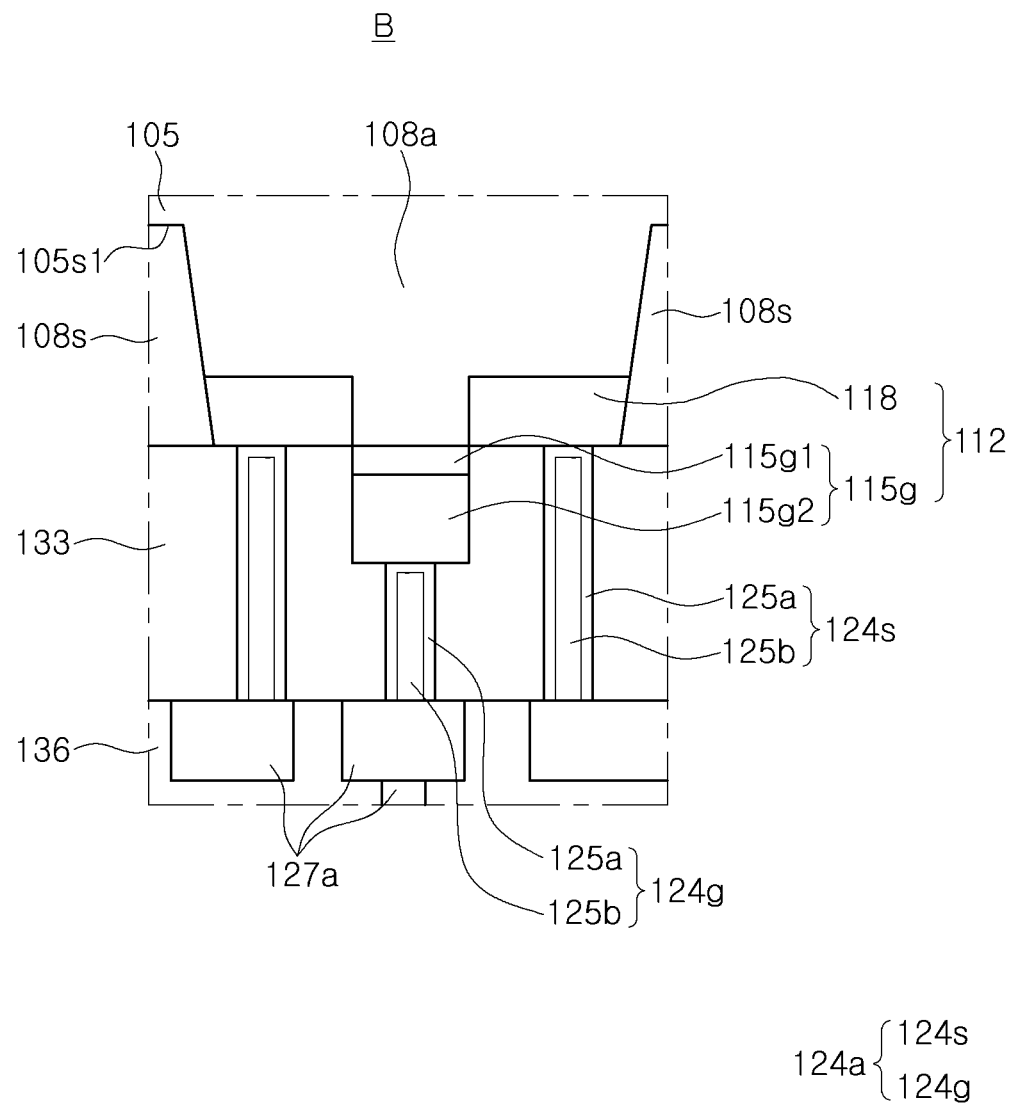

Next, an example of the circuit contact plug 124a will be described with reference to FIG. 3B. FIG. 3B is a partially enlarged view of a region denoted by 'B' in FIG. 2B.

Referring to FIGS. 2B and 3B, each of the first contact plug 124s and the second contact plug 124g of the circuit contact plug 124a may be formed of the same material as the connection contact plug 124b. For example, each of the first contact plug 124s and the second contact plug 124g may include the barrier layer 125a and the plug layer 125b, as described in FIG. 3A. The barrier layer 125a may cover side and bottom surfaces of the plug layer 125b. The first contact plug 124s may be a source/drain contact plug, and the second contact plug 124g may be a gate contact plug.

Figure 4:
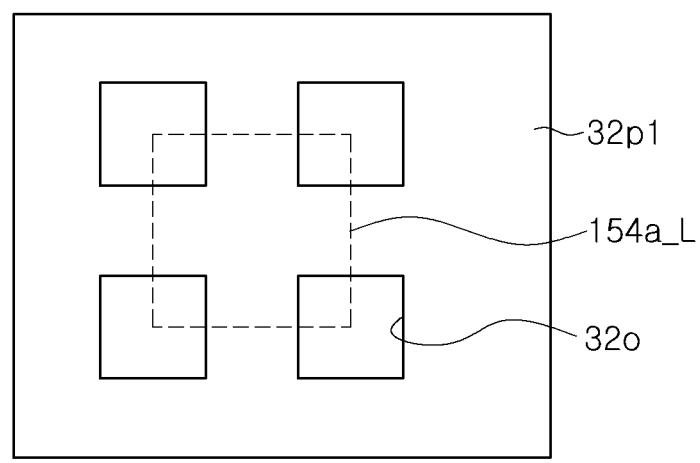
FIG. 4 is a partially enlarged plan view of an image sensor chip according to an example embodiment.

Next, a planar shape of the first lower pad 32p1 described in FIG. 2A will be described with reference to FIG. 4. FIG. 4 is a plan view illustrating a planar shape of the first lower pad 32p1 in FIG. 2A.

Referring to FIGS. 2A and 4, the first lower pad 32p1 may have a circular or rectangular shape having a single opening or a plurality of openings 32o therein. A lower end of the sidewall of the first via hole 154a may overlap the single opening or the plurality of openings 32o while overlapping the first lower pad 32p1.

Next, modified examples of the first conductive connection layer 157a in FIG. 2A and the second conductive connection layer 157b and the chip pad 160 in FIG. 2C will be described with reference to FIGS. 5A and 5B.

Figure 5A:
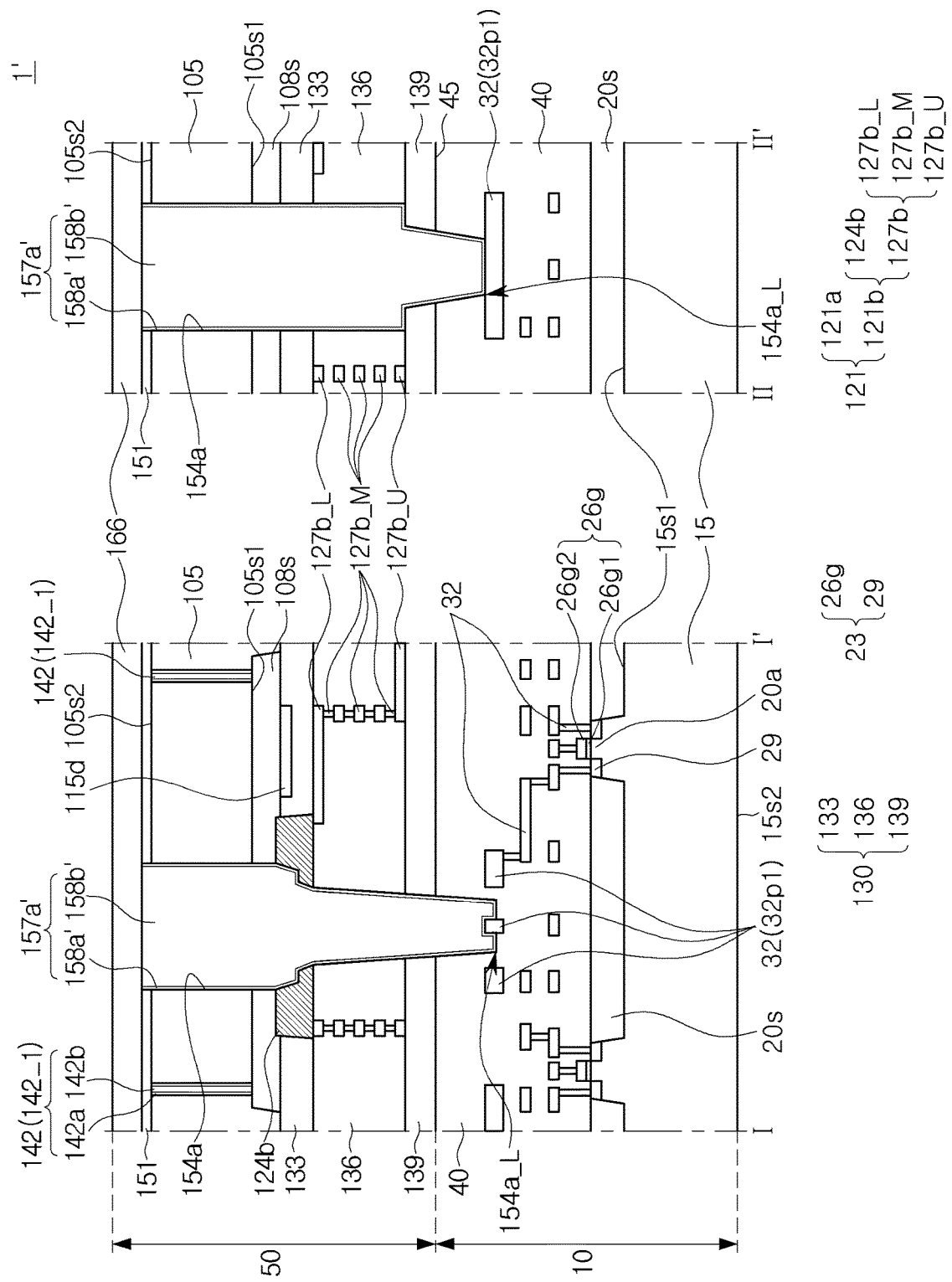
FIGS. 5A and 5B are schematic cross-sectional views of an image sensor chip according to an example embodiment.
Figure 5B:
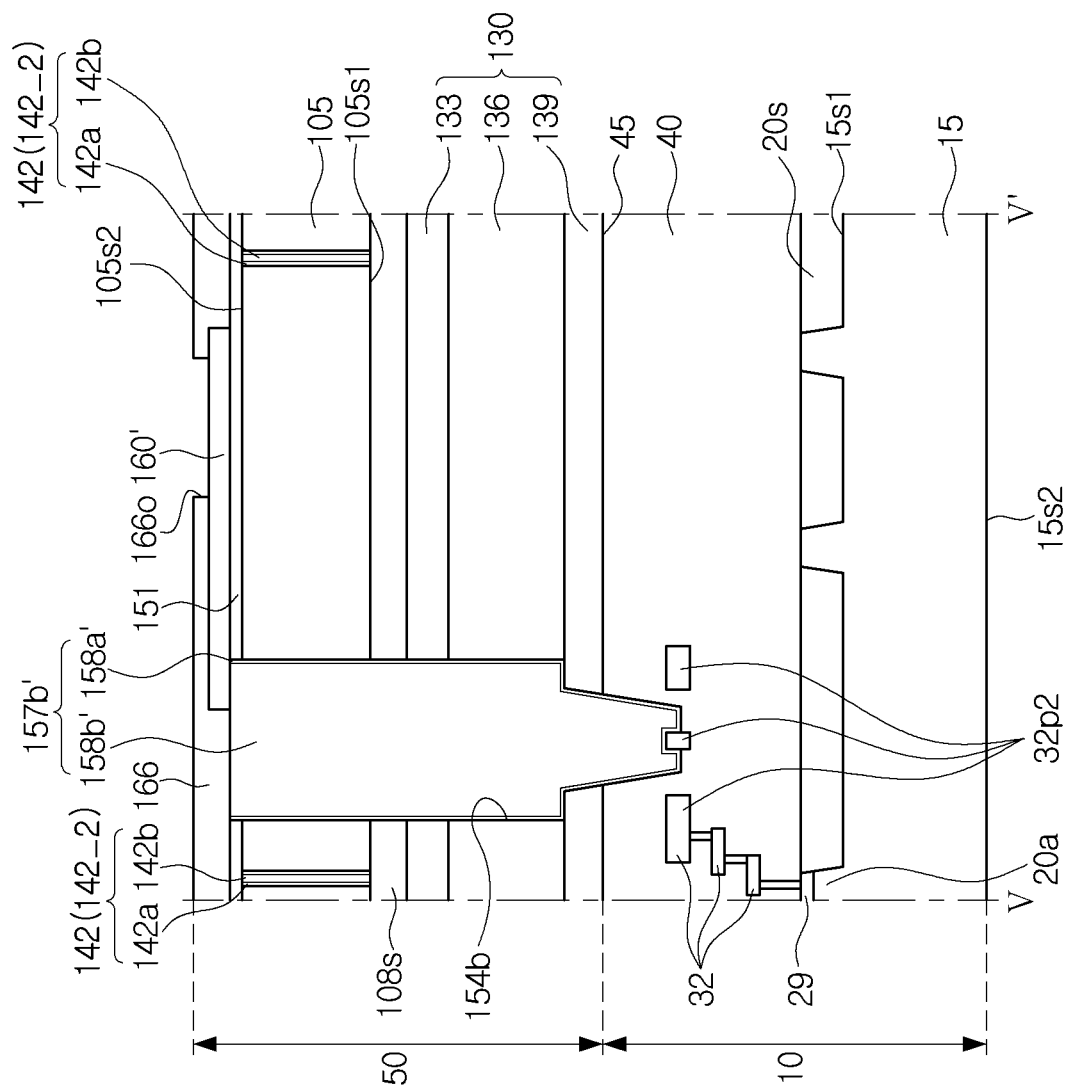

Referring to FIGS. 5A and 5B, the first conductive connection layer 157a in FIG. 2A may be replaced with a first conductive connection layer 157a' (in FIG. 5A) filling the first via hole 154a, and the second conductive connection layer 157b in FIG. 2C may be replaced with a second conductive connection layer 157b' (in FIG. 5B) filling the second via hole 154b. The first and second conductive connection layers 157a' and 157b' may include a first layer 158a' and a second layer 158b'. The first layer 158a' may cover sidewalls and a bottom surface of the second layer 158b'.

In FIG. 2C, the chip pad 160 may cover at least a portion (i.e., extending portion 157e) of an upper surface of the second conductive connection layer 157b while overlapping at least a portion of the second via hole 154b. As illustrated in FIG. 5B, chip pad 160 may be replaced with a chip pad 160' extending in a horizontal direction. A portion of chip pad 160' may extend over a portion of the second conductive layer 157b'.

Figure 6A:
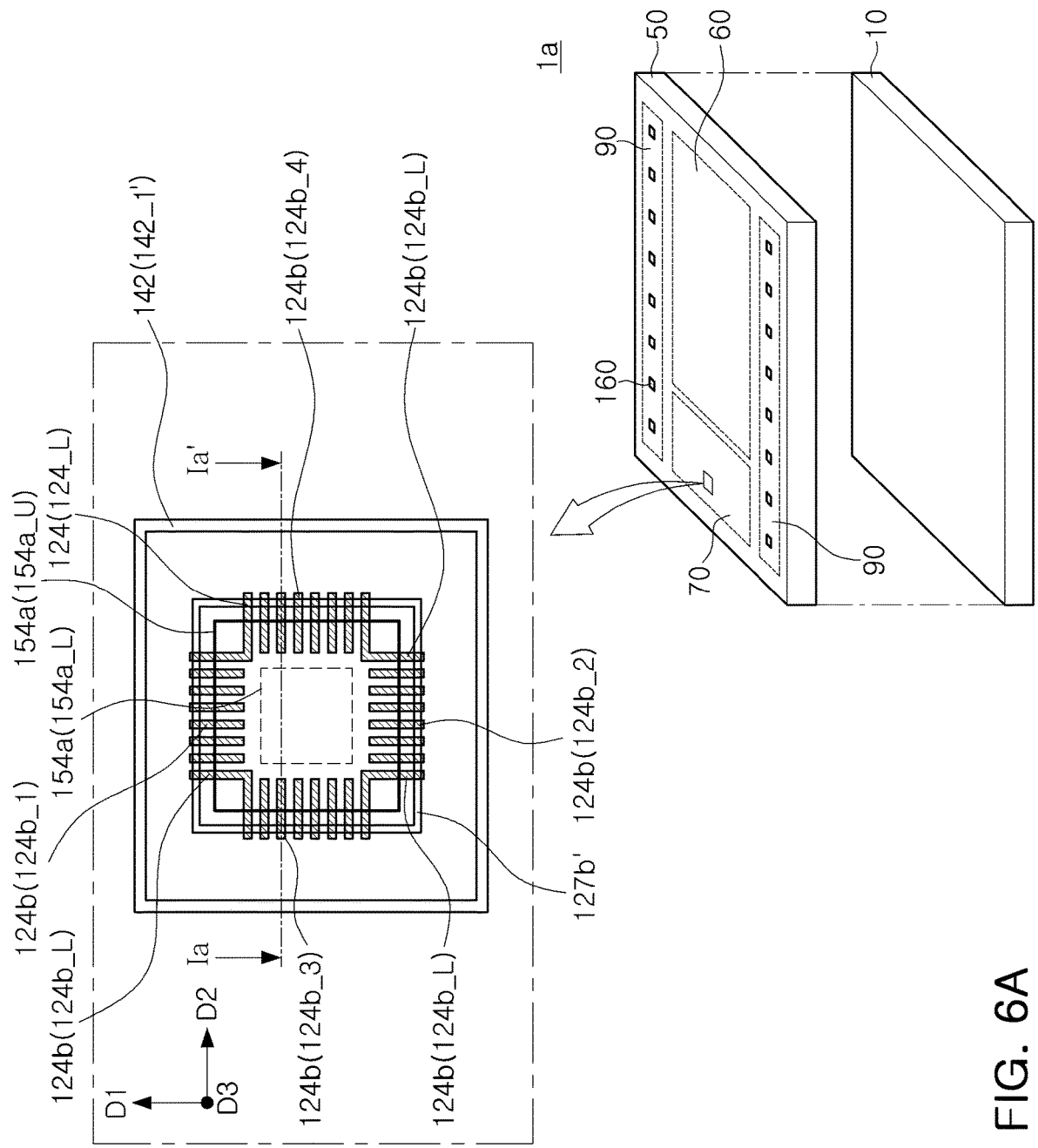
FIGS. 6A and 6B are schematic cross-sectional views illustrating a modified example of an image sensor chip according to an example embodiment.
Figure 6B:
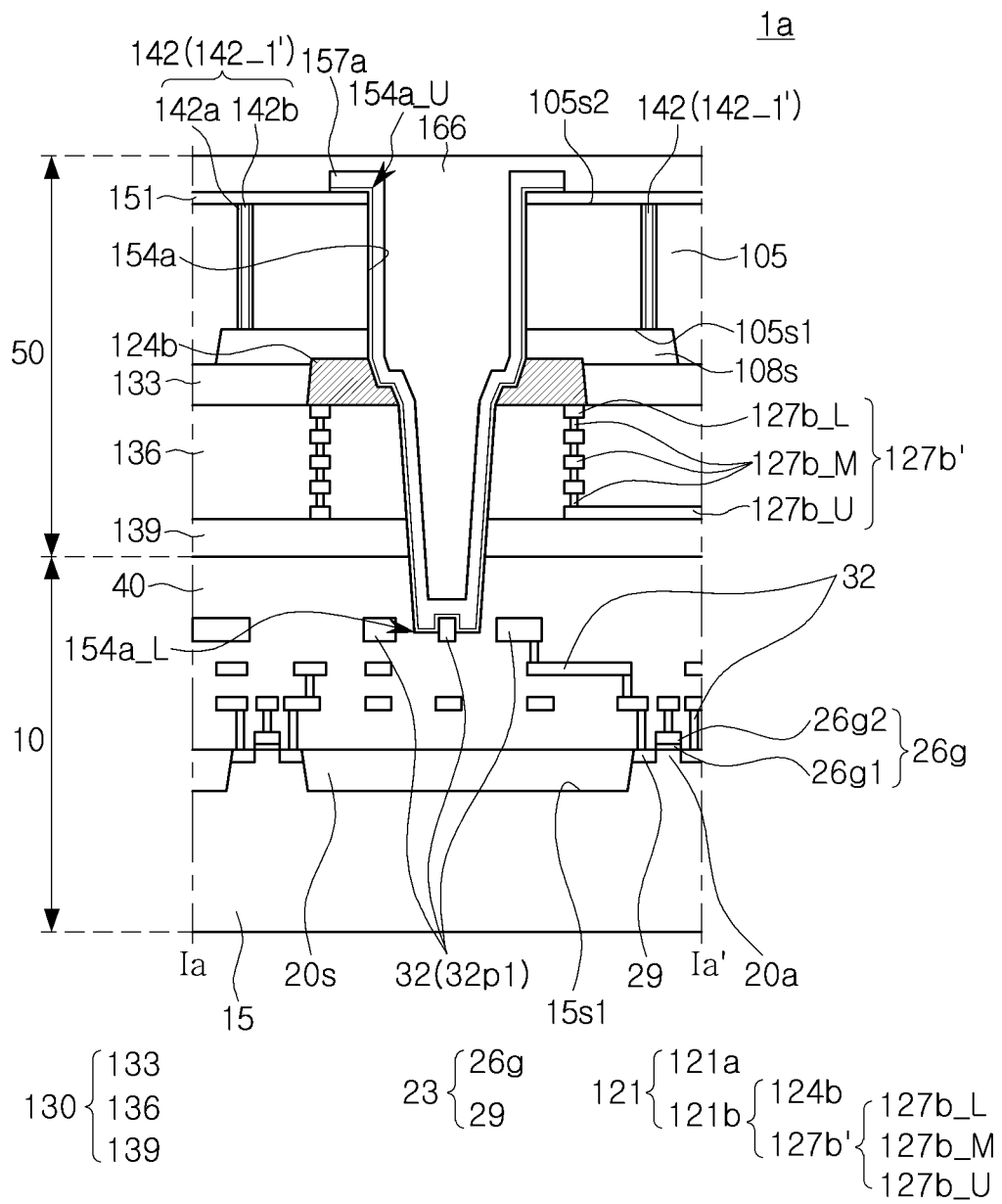

Next, a modified example of the image sensor chip according to an example embodiment will be described with reference to FIGS. 6A and 6B. FIG. 6A is a schematic perspective view illustrating an example in which some components in FIG. 1 are modified, and FIG. 6B is a cross-sectional view of a region taken along line Ia-Ia' in FIG. 6A. Hereinafter, only portions, which may be modified in the image sensor chip 1 described with reference to FIG. 1 and FIGS. 2A to 2C, will be described with reference to FIGS. 6A and 6B. Hereinafter, among the components illustrated in FIGS. 6A and 6B, unexplained components may be understood as being components described with reference to FIG. 1 FIGS. 2A to 2C. In addition, when a description is given with reference to FIGS. 6A and 6B, the same components as those described with reference to FIG. 1 and FIGS. 2A to 2C will be described without additional description by directly referring to components illustrated in FIGS. 6A and 6B.

Referring to FIGS. 6A and 6B, an image sensor chip 1a may include a first separation structure 142_1', a modified example of the first separation structure 142_1 illustrated in FIGS. 1 and 2A. For example, in the first separation structure 142_1', first and second bar patterns 124b_1 and 124b_2 may be spaced apart from each other by a first distance in a first horizontal direction D1 and third and fourth bar patterns 124b_3 and 124b_4 may be spaced apart from each other by the first distance in a second horizontal direction D2. Therefore, in the first separation structure 142_1', a distance between the first and second bar patterns 124b_1 and 124b_2 spaced apart from each other in the first horizontal direction D1 may be substantially the same as a distance between the third and fourth bar patterns 124b_3 and 124b_4 spaced apart from each other in the second horizontal direction D2.

In an example, the above-described dummy gate electrode 115d (in FIGS. 1 and 2A) may be omitted.

In the above-described cross-sectional structure indicated by line I-I' in FIG. 2A, the lower interconnection line layer 127b_L, the middle interconnection line layer 127b_M, and the upper interconnection line layer 127b_U may be stacked in a region in which a portion of the multilayer interconnection line 127b (in FIG. 2A) overlaps the connection contact plug 124b in the vertical direction D3, and the lower interconnection line layer 127bL, the middle interconnection line layer 127bM, and the upper interconnection line layer 127b_U may be stacked in a region in which another portion of the multilayer interconnection line 127b (in FIG. 2A) does not overlap the connection contact plug 124b in the vertical direction D3. For example, the middle interconnection line layer 127b_M (in FIG. 2A) and the upper interconnection line layer 127b_U (in FIG. 2A) may overlap the third bar patterns 124b_3 (in FIG. 1) and may not overlap the fourth bar patterns 124b_4 (in FIG. 1).

In the cross-sectional structure indicated by line Ia-Ia' in FIG. 6B in the modified example, the lower interconnection line layer 127b_L, the middle interconnection line layer 127b M, and the upper interconnection line layer 127b U may be stacked in a region in which the multilayer interconnection line 127b' overlaps the connection contact plug 124b in the vertical direction D3. For example, at least a portion of the multilayer interconnection line 127b' may have a rectangular ring shape overlapping the connection contact plug 124b in the vertical direction D3. At least one of the lower interconnection line layer 127b_L, the middle interconnection line layer 127b_M, and the upper interconnection line layer 127b_U may have a rectangular ring shape overlapping the connection contact plug 124b in the vertical direction D3. The lower interconnection line layer 127b_L, the middle interconnection line layer 127b_M, and the upper interconnection line layer 127b_U may be stacked while overlapping the connection contact plug 124b in the vertical direction D3. For example, the middle interconnection line layer 127b_M (in FIG. 6B) and the upper interconnection line layer 127b_U (in FIG. 6B) may overlap the third bar patterns 124b_3 (in FIG. 6A) and the fourth bar patterns 124b_4 (in FIG. 6A).

In the multilayer interconnection line 127b', one of the lower interconnection line layer 127b_L, the middle interconnection line layer 127b_M, and the upper interconnection line layer 127b_U may extend in the first horizontal direction D1 and/or the second horizontal direction D2 to be electrically connected to the above-described multilayer circuit interconnection 127a (in FIG. 2B). For example, in the multilayer interconnection line 127b', a portion of the upper interconnection line layer 127b_U may extend in the first horizontal direction D1 and/or the second horizontal direction D2 to be electrically connected to the above-described multilayer circuit interconnection 127a (in FIG. 2B).

Figure 7:
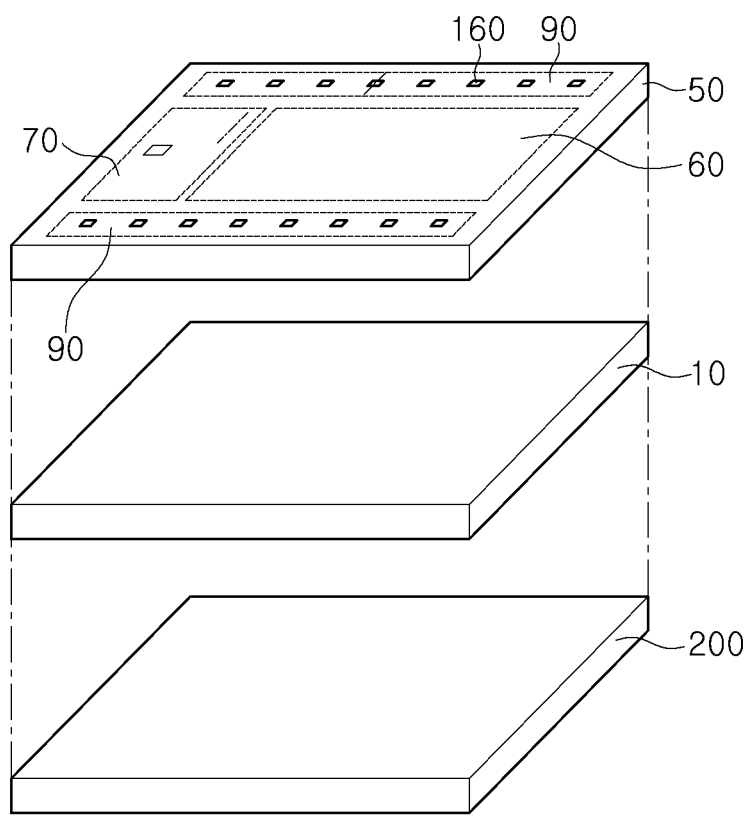
FIG. 7 is a schematic perspective view illustrating a modified example of an image sensor chip according to an example embodiment.

Next, another modified example of an image sensor chip according to an example embodiment will be described with reference to FIG. 7. FIG. 7 is a schematic perspective view of a modified example of an image sensor chip according to an example embodiment.

Referring to FIG. 7, an image sensor chip 1" may further include a memory chip 200 in addition to the lower chip 10 and the upper chip 50 described in FIG. 1. The lower chip 10 may be disposed between the memory chip 200 and the upper chip 50. The memory chip 200 may include a DRAM chip.

Figure 8:
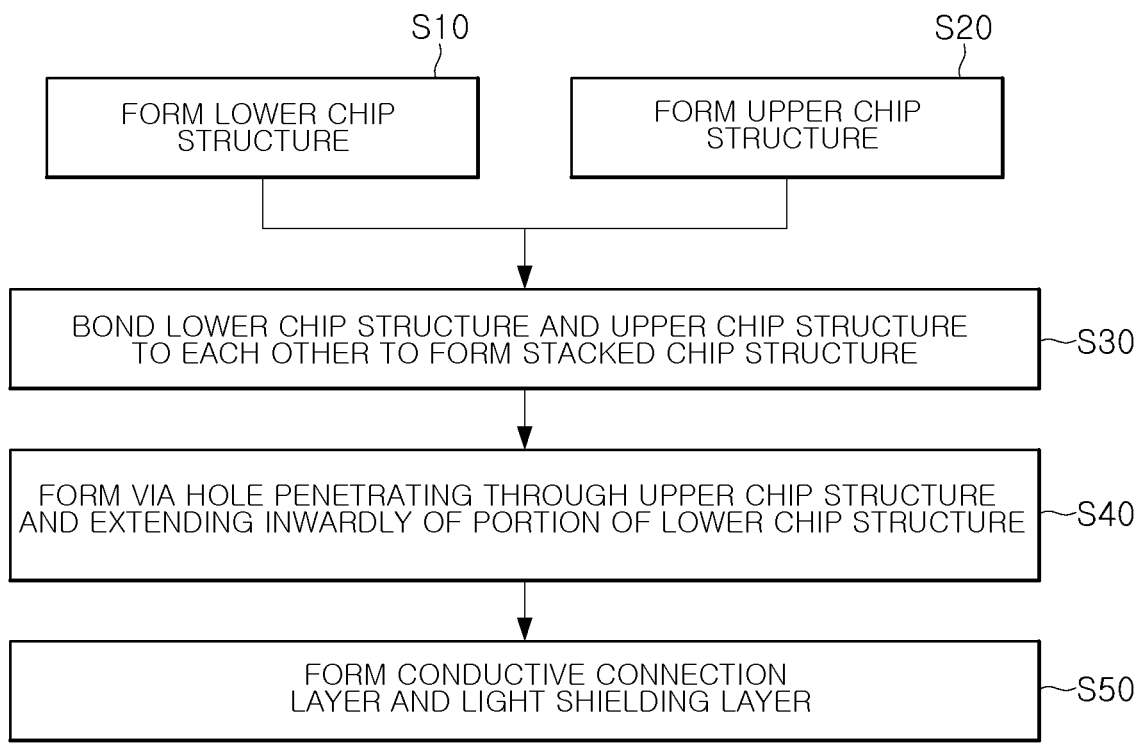
FIG. 8 is a schematic flowchart illustrating a method of forming an image sensor chip according to an example embodiment.

Next, an example of a method of forming an image sensor chip according to an example embodiment will be described with reference to FIG. 8. FIG. 8 is a schematic flowchart illustrating a method of forming an image sensor chip according to an example embodiment.

Referring to FIGS. 1, 2A to 2C, and 8, a lower chip structure may be formed (S10). An upper chip structure may be formed (S20). The lower chip structure and the upper chip structure may be bonded to each other to form a stacked chip structure (S30).

In an example, the lower chip structure may be substantially the same as the lower chip 10 described in FIG. 1 and FIGS. 2A to 2C. In an example, the upper chip structure may be a portion of the upper chip 50 described with reference to FIGS. 1 and 2A to 2C. For example, the upper chip structure may include the upper substrate 105, and the upper element 112, the upper interconnection structure 121, and the upper insulating layer 130 formed on the third surface 105s1 of the upper substrate 105.

The separation structure 142, formed in the upper substrate 105, may be formed before bonding the upper chip structure and the lower chip structure to each other or after bonding the upper chip structure and the lower chip structure to each other.

Via holes 154a and 154b, penetrating the upper chip structure and extending into a portion of the lower chip structure, may be formed (S40). The via holes 154a and 154b may be the first via hole 154a in FIG. 2A and the second via hole 154b in FIG. 2C.

Before forming the via holes 154a and 154b, the backside insulating layer 151 may be formed on the fourth surface 105s2 of the upper substrate 105.

Conductive connection layers 157a and 157b and a light shielding layer 157c may be formed (S50). The conductive connection layers 157a and 157b may be the first conductive connection layer 157a in FIG. 2A and the second conductive connection layer 157b in FIG. 2C, and the light shielding layer 157c may be the light shielding layer 157c in FIG. 2B. The second backside insulating layer 166, the color filter 163, and the microlens 169 may be formed on the fourth surface 105s2 of the upper substrate 105.

As described above, an image sensor chip including an upper chip, including a photoelectric element, and a lower chip, including an integrated circuit, may be provided. Since the image sensor includes the upper chip and the lower chip, a miniaturized sensor chip may be provided. Accordingly, the image sensor chip may satisfy requirements for miniaturization of electronic products such as digital cameras, mobile phone cameras, portable camcorders, and the like.

While example embodiments have been shown and described above, it will be apparent to those skilled in the art that modifications and variations could be made without departing from the scope of the present inventive concept as defined by the appended claims.

What is claimed is:

1. An image sensor chip comprising:
   a lower chip;
   an upper chip stacked on the lower chip and including a first photoelectric element;
   a first via hole penetrating through the upper chip and penetrating through at least a portion of the lower chip; and
   a first conductive connection layer in the first via hole,
   wherein the lower chip includes a lower substrate having a first surface and a second surface opposing each other, a lower interconnection structure including a first lower pad on the first surface of the lower substrate, and a lower insulating structure covering the lower interconnection structure on the first surface of the lower substrate,
   the upper chip further includes an upper substrate having a third surface and a fourth surface opposing each other, an upper element and an upper interconnection structure below the third surface of the upper substrate, and an upper insulating structure covering the upper element and the upper interconnection structure below the third surface of the upper substrate,
   a lower surface of the upper insulating structure contacts an upper surface of the lower insulating structure,
   the third surface of the upper substrate and the first surface of the lower substrate face each other,
   the upper interconnection structure includes an upper circuit interconnection structure and an upper interconnection line structure,
   the upper circuit interconnection structure includes a circuit contact plug electrically connected to the upper element, and a multilayer circuit interconnection line electrically connected to the circuit contact plug,
   the upper interconnection line structure includes a connection contact plug and a multilayer interconnection line below and contacting the connection contact plug,
   the first conductive connection layer is in contact with the connection contact plug in the upper chip and the first lower pad in the lower chip and is spaced apart from the multilayer interconnection line in the upper chip, the first conductive connection layer is configured to electrically connect the connection contact plug and the first lower pad to each other, the upper element includes a transistor including a source/drain region, a gate dielectric layer and a gate electrode, at least a portion of the gate electrode is at the same level as a portion of the connection contact plug, the gate electrode has an upper surface contacting the gate dielectric layer and a lower surface opposing the upper surface of the gate electrode, and a lower surface of the connection contact plug is at a lower level than the lower surface of the gate electrode.

2. The image sensor chip of claim 1, wherein the circuit contact plug includes a first contact plug, in contact with the source/drain region, and a second contact plug in contact with the gate electrode, the connection contact plug includes the same material as at least one of the first contact plug and the second contact plug, the gate dielectric layer includes a lower surface contacting the gate electrode and an upper surface contacting an active region of the upper substrate, the lower surface of the connection contact plug is substantially at a same level as a lower surface of at least one of the first contact plug and the second contact plug, the connection contact plug includes a first conductive material, and the multilayer interconnection line includes a second conductive material different from the first conductive material.

3. The image sensor chip of claim 2, wherein each of the connection contact plug, the first contact plug, and the second contact plug includes a plug layer and a barrier layer, and the barrier layer covers a side surface and a bottom surface of the plug layer.

4. The image sensor chip of claim 3, wherein the multilayer interconnection line comprises:

a lower interconnection line layer;

an upper interconnection line layer; and a middle interconnection line layer disposed between the lower interconnection line layer and the upper interconnection line layer to electrically connect the lower interconnection line layer and the upper interconnection line layer to each other, and wherein the lower interconnection line layer is in contact with a surface of the plug layer of the connection contact plug.

5. The image sensor chip of claim 1, wherein the upper chip further includes an upper isolation layer defining an upper active region, the first via hole penetrates through a portion of the upper isolation layer, and the connection contact plug overlaps the upper isolation layer adjacent to the first via hole.

6. The image sensor chip of claim 1, wherein the connection contact plug comprises:

first bar patterns extending in a first horizontal direction, and disposed parallel to each other;

second bar patterns extending in the first horizontal direction while facing the first bar patterns, and disposed parallel to each other;

third bar patterns extending in a second horizontal direction, perpendicular to the first horizontal direction, and disposed parallel to each other; and fourth bar patterns extending in the second horizontal direction while facing the third bar patterns, and disposed parallel to each other.

7. The image sensor chip of claim 5, wherein an upper end of a sidewall of the first via hole overlaps the connection contact plug in a vertical direction.

8. The image sensor chip of claim 7, wherein a lower end of the sidewall of the first via hole does not overlap the connection contact plug in the vertical direction.

9. The image sensor chip of claim 5, wherein a maximum thickness of the upper isolation layer is greater than a distance between the connection contact plug and the upper substrate.

10. The image sensor chip of claim 1, wherein a portion of the connection contact plug, in contact with the first conductive connection layer, comprises:

a first side portion;

a second side portion; and an inflection portion disposed between the first side portion and the second side portion and extending in a direction substantially parallel to the third surface.

11. The image sensor chip of claim 10, wherein in the connection contact plug, a thickness of a first portion having the first side portion is greater than a thickness of a second portion having the second side portion, and a distance between the second side portion and the upper substrate is greater than a distance between the first side portion and the upper substrate.

12. The image sensor chip of claim 1, wherein the first photoelectric element is disposed in the upper substrate, and wherein the upper chip comprises:

a second photoelectric element disposed in the upper substrate;

a backside insulating layer on the fourth surface of the upper substrate;

a microlens overlapping the first photoelectric element on the backside insulating layer; and a light shielding layer overlapping the second photoelectric element on the backside insulating layer.

13. The image sensor chip of claim 12, wherein the light shielding layer is formed of the same material as the first conductive connection layer.

14. The image sensor chip of claim 1, further comprising:

a second via hole penetrating through the upper chip and penetrating through at least a portion of the lower chip;

a second conductive connection layer in the second via hole; and a chip pad electrically connected to the second conductive connection layer on the fourth surface of the upper substrate.

15. An image sensor chip comprising:

a lower chip;

an upper chip stacked on the lower chip and including a photoelectric element;

a via hole penetrating through at least a portion of the upper chip and penetrating through at least a portion of the lower chip; and a conductive connection layer electrically connecting the lower chip and the upper chip to each other in the via hole, wherein the lower chip includes a lower substrate having a first surface and a second surface opposing each other, a lower interconnection structure including a first lower pad on the first surface of the lower substrate, and a lower insulating structure covering the lower interconnection structure on the first surface of the lower substrate, the upper chip includes an upper substrate having a third surface and a fourth surface opposing each other, an upper isolation layer and an upper element below the third surface of the upper substrate, an upper interconnection line structure below the upper isolation layer, an upper insulating structure covering the upper interconnection line structure below the upper isolation layer, and a separation structure penetrating through the upper substrate while being in contact with the upper isolation layer, the upper interconnection line structure includes a connection contact plug, in contact with the upper isolation layer and the conductive connection layer, and a multilayer interconnection line electrically connected to the connection contact plug, the upper element includes a first upper gate electrode, and a thickness of the connection contact plug is different from a thickness of the first upper gate electrode, and wherein the connection contact plug comprises:

first bar patterns extending in a first horizontal direction, and disposed parallel to each other;

second bar patterns extending in the first horizontal direction while facing the first bar patterns, and disposed parallel to each other;

third bar patterns extending in a second horizontal direction, perpendicular to the first horizontal direction, and disposed parallel to each other; and fourth bar patterns extending in the second horizontal direction while facing the third bar patterns, and disposed parallel to each other.

16. The image sensor chip of claim 15, wherein the upper chip further includes a second upper gate electrode and a circuit contact plug in contact with the second upper gate electrode, the circuit contact plug and the connection contact plug include a plug layer and a barrier layer covering a side surface and a bottom surface of the plug layer, and at least a portion of the first upper gate electrode is at the same level as a portion of the connection contact plug.

17. The image sensor chip of claim 16, wherein the second upper gate electrode includes polysilicon, the plug layer includes tungsten, the barrier layer includes a metal nitride, and at least a portion of the multilayer interconnection line includes copper.

18. The image sensor chip of claim 15, further comprising:

a dummy gate electrode on the upper isolation layer, wherein a thickness of the dummy gate electrode is less than a thickness of the connection contact plug.

19. An image sensor chip comprising:

a lower chip;

an upper chip stacked on the lower chip and including a first photoelectric element and a second photoelectric element;

a first via hole and a second via hole, each penetrating through at least a portion of the upper chip and penetrating through at least a portion of the lower chip; and a first conductive connection layer in the first via hole and a second conductive connection layer in the second via hole, wherein the lower chip includes a lower substrate having a first surface and a second surface opposing each other, a lower interconnection structure including a first lower pad and a second lower pad on the first surface of the lower substrate, and a lower insulating structure covering the lower interconnection structure on the first surface of the lower substrate, the upper chip further includes an upper substrate having a third surface and a fourth surface opposing each other, an upper element, an upper circuit interconnection structure, and an upper interconnection line structure below the third surface of the upper substrate, an upper insulating structure covering the upper element, the upper circuit interconnection structure, and the upper interconnection line structure below the third surface of the upper substrate, a backside insulating layer on the fourth surface of the upper substrate, a microlens overlapping the first photoelectric element on the backside insulating layer, and a light shielding layer overlapping the second photoelectric element on the backside insulating layer, the upper circuit interconnection structure includes a circuit contact plug, electrically connected to the upper element including a gate electrode, and a multilayer circuit interconnection line electrically connected to the circuit contact plug on the circuit contact plug, the upper interconnection line structure includes a connection contact plug and a multilayer interconnection line in contact with the connection contact plug, the circuit contact plug and the connection contact plug include a plug layer and a barrier layer covering at least a sidewall of the plug layer, the first conductive connection layer is in contact with the connection contact plug and the first lower pad, the second conductive connection layer is spaced apart from the multilayer interconnection line in the upper chip and is in contact with the second lower pad, the first and second conductive connection layers extending onto the backside insulating layer while covering the first and second via holes, and each of the first and second conductive connection layers, disposed on the backside insulating layer, has substantially the same thickness as the light shielding layer.

20. The image sensor chip of claim 19, further comprising:

a chip pad electrically connected to the second conductive connection layer and spaced apart from the first conductive connection layer, wherein the upper element includes an upper gate electrode, the circuit contact plug includes a gate contact plug in contact with the upper gate electrode, the connection contact plug and the gate contact plug include a plug layer and a barrier layer covering at least a sidewall of the plug layer, at least a portion of the upper gate electrode is at the same level as a portion of the connection contact plug, and the first and second conductive connection layers and the light shielding layer are formed of the same material.

* * * * *